United States Patent
Jeon

(10) Patent No.: US 10,522,219 B2
(45) Date of Patent: Dec. 31, 2019

(54) SEMICONDUCTOR MEMORY DEVICE AND METHOD OF PROGRAMMING MULTI BIT DATA OF THE SAME

(71) Applicant: SK hynix Inc., Gyeonggi-do (KR)

(72) Inventor: Yoo Nam Jeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 476 days.

(21) Appl. No.: 13/844,919

(22) Filed: Mar. 16, 2013

(65) Prior Publication Data

US 2014/0126298 A1 May 8, 2014

(30) Foreign Application Priority Data

Nov. 5, 2012 (KR) .......................... 10-2012-0124235

(51) Int. Cl.
G11C 16/10 (2006.01)
G11C 11/56 (2006.01)
G11C 16/04 (2006.01)

(52) U.S. Cl.
CPC ...... G11C 11/5642 (2013.01); G11C 11/5635 (2013.01); *G11C 16/0483* (2013.01); *G11C 2216/14* (2013.01)

(58) Field of Classification Search
CPC .......................... G11C 11/5642; G11C 11/5635
See application file for complete search history.

(56) References Cited

U.S. PATENT DOCUMENTS

| 7,548,457 | B2 | 6/2009 | Kang et al. | |
|---|---|---|---|---|
| 2007/0253249 | A1* | 11/2007 | Kang | G11C 11/5628 365/185.03 |
| 2008/0144394 | A1* | 6/2008 | Ando | G11C 16/0416 365/185.27 |
| 2008/0192540 | A1* | 8/2008 | Kong | G11C 11/5628 365/185.03 |
| 2009/0122617 | A1* | 5/2009 | Noh | G11C 16/3404 365/185.24 |
| 2009/0175081 | A1* | 7/2009 | Kim | 365/185.11 |

(Continued)

FOREIGN PATENT DOCUMENTS

KR 1020080018495 2/2008
KR 10-2008-0054333 6/2008

(Continued)

OTHER PUBLICATIONS

Office Action issued by the Korean Intellectual Property Office dated Apr. 18, 2019.

(Continued)

*Primary Examiner* — Mushfique Siddique
(74) *Attorney, Agent, or Firm* — IP & T Group LLP

(57) ABSTRACT

A method of operating a semiconductor memory device may include increasing threshold voltage of memory cells by performing an LSB program operation on the memory cells having first state, decreasing threshold voltage of memory cells to be programmed to second state of the memory cells to a level lower than a first level in unit of a memory cell for an MSB program operation, and increasing threshold voltage of memory cells to be programmed to third state of the memory cells to a level higher than a second level, which is higher than the first level, in unit of a memory cell for an MSB program operation.

9 Claims, 9 Drawing Sheets

(56) References Cited

U.S. PATENT DOCUMENTS

| | | | | |
|---|---|---|---|---|
| 2010/0008139 | A1* | 1/2010 | Bae | 365/185.03 |
| 2011/0044104 | A1* | 2/2011 | Kang | G11C 11/5628 |
| | | | | 365/185.03 |
| 2011/0141808 | A1* | 6/2011 | Haratsch | G11C 11/5628 |
| | | | | 365/185.03 |
| 2011/0157998 | A1* | 6/2011 | Yang | G11C 16/10 |
| | | | | 365/185.22 |
| 2011/0292725 | A1* | 12/2011 | Choi | G11C 11/5628 |
| | | | | 365/185.03 |
| 2012/0275224 | A1* | 11/2012 | Park | G11C 11/5628 |
| | | | | 365/185.11 |
| 2013/0094294 | A1* | 4/2013 | Kwak | H01L 27/1157 |
| | | | | 365/185.03 |
| 2014/0095770 | A1* | 4/2014 | Huang | G11C 11/5642 |
| | | | | 711/103 |

FOREIGN PATENT DOCUMENTS

| | | |
|---|---|---|
| KR | 10-2008-0084230 | 9/2008 |
| KR | 1020080113918 | 12/2008 |
| KR | 10-2010-0006085 | 1/2010 |
| KR | 10-2010-0110766 | 10/2010 |
| KR | 10-2012-0121169 | 11/2012 |

OTHER PUBLICATIONS

Notice of Allowance issued by the Korean Intellectual Property Office dated Oct. 25, 2019.

* cited by examiner

| | BLo | | BLe | |
|---|---|---|---|---|
| | 1 | LSB | 0 | LSB | WL00
| | 5 | MSB | 4 | MSB |
| | 3 | LSB | 2 | LSB | WL01
| | 9 | MSB | 8 | MSB |
| | 7 | LSB | 6 | LSB | WL02

FIG. 10

|  | program operation | erase operation in the unit of a memory cell |
|---|---|---|
| DSL | Vcc | $V_{H1}$ (EX: 15V) |
| BL | 0V OR Vcc | $V_{H2}$ (EX: 20V) |
| selected WL | Vpgm | 0V |
| unselected WL | Vpass | floating |

SEMICONDUCTOR MEMORY DEVICE AND METHOD OF PROGRAMMING MULTI BIT DATA OF THE SAME

CROSS-REFERENCE TO RELATED APPLICATION

The present application claims priority to Korean Patent Application No. 10-2012-0124235, filed on Nov. 5, 2012, the disclosure of which is incorporated herein by reference in its entirety.

BACKGROUND

Field of Invention

Exemplary embodiments of the present invention relate to semiconductor design technology, and more particularly, to a semiconductor memory device and a method of operating the same.

Description of Related Art

Semiconductor memory devices are classified into volatile memory devices and non-volatile memory devices.

A volatile memory device may perform a read/write operation at a high speed, but may lose data stored therein in a non-powered condition. Meanwhile, a non-volatile memory device performs at relatively slow speed in the read/write operation, but may maintain the stored data even when a power is blocked. Accordingly, the non-volatile memory device is used for storing data, which is to be maintained irrespective of being supplied with the power or not. The non-volatile memory devices include a read-only memory (ROM), a mask read-only memory (MROM), a programmable read-only memory (PROM), an erasable programmable read-only memory (EPROM), an electrically erasable programmable read-only memory (EEPROM), a phase-change random access memory (PRAM), a magnetic random access memory (MRAM), a resistive random access memory (RRAM), a ferroelectric random access memory (FRAM), and a flash memory. The flash memories are classified into a NOR-type flash memory and a NAND-type flash memory.

The flash memories have an advantage of a random access memory (RAM) for freely programming and erasing data and an advantage of a read-only memory (ROM) for maintaining the stored data even in a non-powered condition. The flash memories have been widely used as a storage medium of portable electronic devices, such as a digital camera, a personal digital assistant PDA, and an MP3 player.

Recently, size of memory cells in the flash memory has reduced and space between the memory cells became narrower. Therefore, threshold voltage distribution of the memory cells may be deteriorated due to interferences between the adjacent memory cells.

SUMMARY OF THE INVENTION

Exemplary embodiments of the present invention are directed to a semiconductor memory device that may improve threshold voltage distribution of memory cells and a method of operating the same.

A method of operating a semiconductor memory device in accordance with one embodiment of the present invention may include increasing threshold voltage of memory cells by performing an LSB program operation on the memory cells having first state, decreasing threshold voltage of a memory cells to be programmed to second state of the memory cells to a level lower than a first level in unit of a memory cell for an MSB program operation, and increasing threshold voltage of memory cells to be programmed to third state of the memory cells to a level higher than a second level, which is higher than the first level, in unit of a memory cell for the MSB program operation.

A semiconductor memory device in accordance with one embodiment of the present invention may include a memory cell array configured to include memory cells, an operation circuit configured to perform an LSB program operation and an MSB program operation on memory cells having first state, and a control circuit configured to control the operation circuit, to decrease threshold voltage of a memory cell to be programmed to second state to a level lower than a first level, to increase threshold voltage of a memory cell to be programmed to third state to a level more than a second level, and to increase threshold voltage of a memory cell to be programmed to fourth state to a level more than a third level when an MSB program operation is performed. Here, the second level is higher than the first level, and the third level is higher than the second level.

A semiconductor memory device in accordance with another embodiment of the present invention may include a memory cell array configured to include memory cells, an operation circuit configured to increase or decrease threshold voltage of the memory cells, and a control circuit configured to control the operation circuit, to increase threshold voltage of a memory cell, where first data is to be stored, in a first page for programming of multi bit data to a level more than a first level, and to decrease threshold voltage of a memory cell, where second data is to be stored, to a level lower than second level that is lower than the first level.

In accordance with the embodiments of the present invention, threshold voltage distribution of memory cells in a semiconductor memory may be improved by reducing change of threshold voltage of the memory cells due to interferences between the memory cells.

BRIEF DESCRIPTION OF THE DRAWINGS

The above and other features and advantages of the present invention will become readily apparent by reference to the following detailed description when considered in conjunction with the accompanying drawings wherein:

FIG. 10 is a table for explaining voltage supply condition in a program operation and a erase operation in accordance with the embodiment of the present invention;

DETAILED DESCRIPTION

Figure 1:
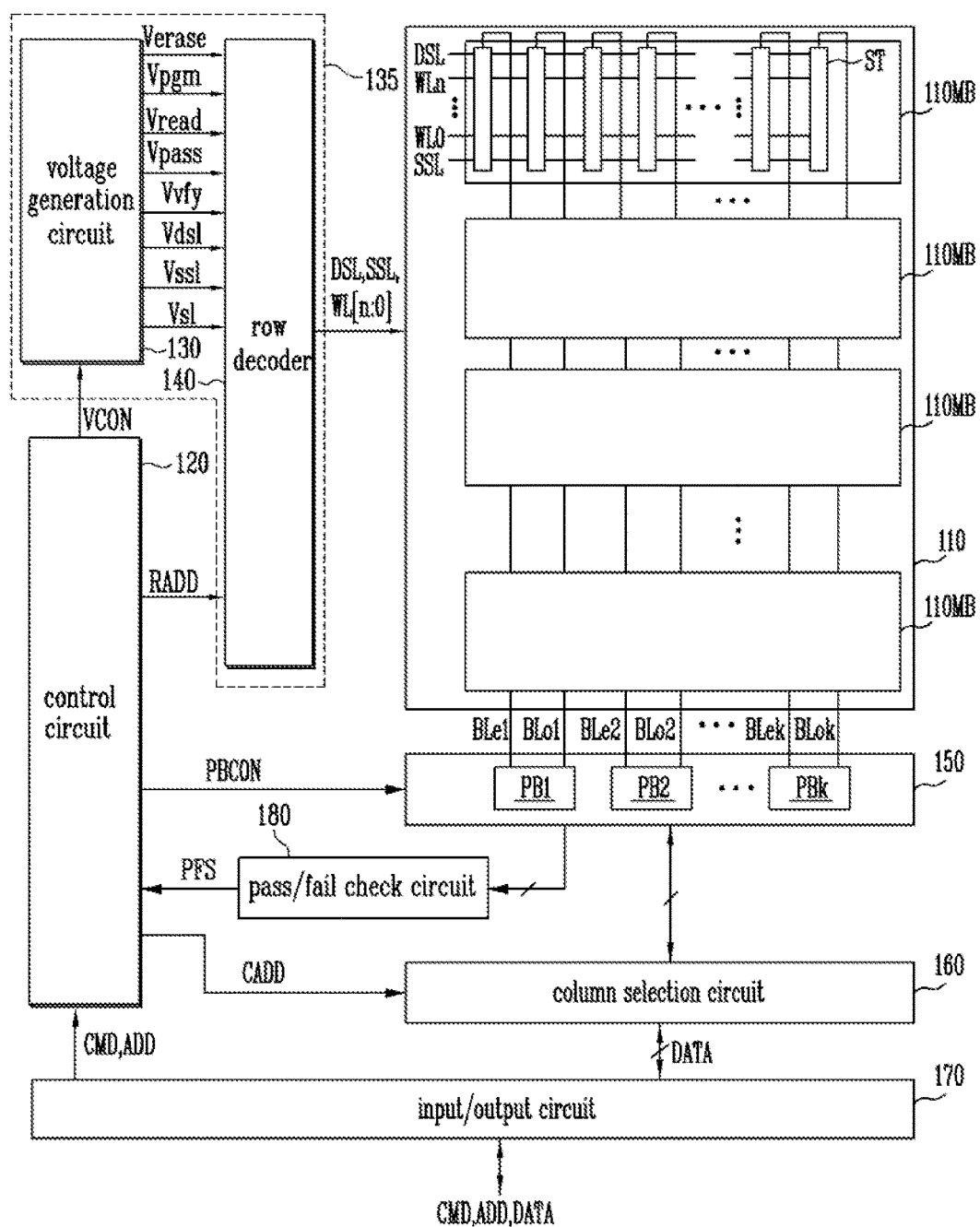
FIG. 1 is a block diagram illustrating a semiconductor memory device in accordance with an embodiment of the present invention.

Hereinafter, the preferred embodiments of the present invention will be explained in more detail with reference to the accompanying drawings. Although embodiments have been described with reference to a number of illustrative embodiments thereof, it should be understood that numerous other modifications and embodiments can be devised by those skilled in the art that will fall within the spirit and scope of the principles of this disclosure. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 2:
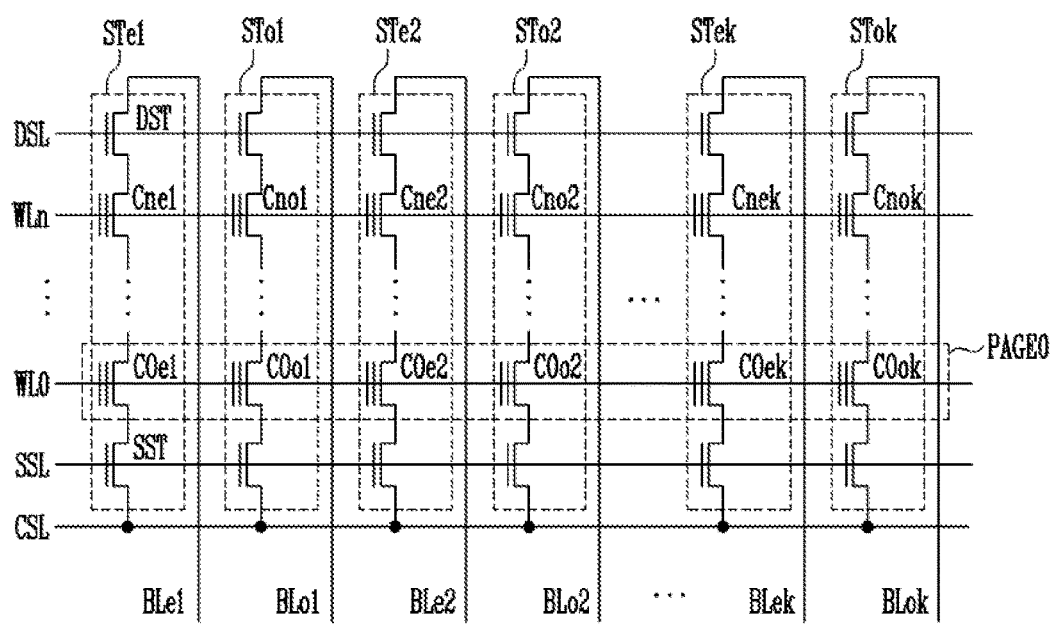
FIG. 2 is a detailed diagram illustrating a memory block shown in FIG. 1.

FIG. 1 is a block diagram illustrating a semiconductor memory device in accordance with an embodiment of the present invention. FIG. 2 is a detailed diagram illustrating a memory block shown in FIG. 1.

Referring to FIG. 1, the semiconductor memory device may include a memory cell array 110 having memory blocks 110MBs, an operation circuit for performing a program operation, a read operation, and an erase operation of memory cells included in a selected page of the memory block 110MB, and a control circuit 120 for controlling the operation circuit. Hereafter, it is assumed that the semiconductor memory device is a NAND flash memory device. The operation circuit may include a voltage supply circuit 135, a page buffer block 150, a column selection circuit 160, an input/output circuit 170, and a pass/fail check circuit 180. Further, the voltage supply circuit 135 may include a voltage generation circuit 130 and a row decoder 140.

The memory cell array 110 includes the memory blocks 110MBs.

In FIG. 2, each of the memory blocks 110MBs may include cell strings STe1~STek and STo1~STok. Each of the cell strings STe1~STek and STo1~STok is coupled between respective bit lines BLe1~BLek and BLo1~BLok and a common source line CSL. That is, the cell strings STe1~STok are respectively coupled to the corresponding bit lines BLe1~BLok and are coupled in common to the common source line CSL. Each of the cell strings e.g., STe1 may include a source select transistor SST, memory cells C0e1~Cne1, and a drain select transistor DST. A source of the source select transistor SST is coupled to the common source line CSL, and a drain of the drain select transistor DST is coupled to the corresponding bit line, e.g., BLe1. The memory cells C0e1~Cne1 are coupled in series between the source select transistors SST and the drain select transistor DST. A gate of the source select transistor SST is coupled to a source select line SSL, each gate of the memory cells C0e1~Cne1 is coupled to respective word lines WL0~WLn, and a gate of the drain select transistor DST is coupled to a drain select line DSL.

The cell strings STe1~STok have the structure in which an erase operation is performed in the unit of a memory cell. In the conventional art, the cell strings STe1~STok are formed on a p-well area. In accordance with an embodiment of the present invention, the cell strings STe1~STok are formed on a triple well structure with p-well/n-well/p-well. This will be described below.

The memory cells C0e1~C0ek and C0o1~C0ok coupled to a word line WL0 form one physical page PAGE0. Even-numbered memory cells C0e1~C0ek coupled to the word line WL0 may form an even page, and odd-numbered memory cells C0o1~C0ok coupled to the word line WL0 may form an odd page. The page (or the even page or odd page) is to be a basic unit of a program operation and a read operation.

Referring to FIGS. 1 and 2, the control circuit 120 outputs a voltage control signal VCON for generating voltages needed for performing a program operation, a verify operation, and a read operation based on a command signal CMD inputted from an external through the input/output circuit 170. The control circuit 120 also outputs a PB control signal PBCON for controlling page buffers PB1~PBk included in the page buffer block 150 based on operation modes. Further, the control circuit 120 outputs a row address signal RADD and a column address signal CADD based on an address signal ADD inputted from the exterior through the input/output circuit 170.

The voltage supply circuit 135 supplies operation voltages (e.g., Verase, Vpgm, Vread, Vpass, Vvfy, Vdsl, Vssl, and Vcsl) needed for the program operation, the read operation and the erase operation of the memory cells to local lines of a selected memory block in response to the voltage control signal VCON of the control circuit 120, the local lines including the drain select line DSL, the word lines WL0~WLn and the source select line SSL. The voltage generation circuit 130 generates the operation voltages (e.g., Verase, Vpgm, Vread, Vpass, Vvfy, Vdsl, Vssl, and Vcsl) needed form the program operation, the read operation, and the erase operation of the memory cells and outputs to global lines in response to the voltage control signal VCON of the control circuit 120. For example, the voltage generation circuit 130 generates a program voltage Vpgm that is to be supplied to the memory cells of a selected page and a pass voltage Vpass that is to be supplied to memory cells not selected to the global lines when the program operation is performed. The voltage generation circuit 130 generates a read voltage Vread that is to be supplied to the memory cells of the selected page and the pass voltage Vpass that is to be supplied to the memory cells not selected to the global lines when the read operation is performed. The voltage generation circuit 130 generates the erase voltage Verase that is to be supplied to the memory cells of the selected memory block to the global lines when the erase operation is performed. Especially, the voltage generation circuit 130 generates an adjusted bit line voltage and an adjusted voltage Vdsl that is to be supplied to the drain select line DSL and outputs the adjusted voltage Vdsl and the adjusted bit line voltage to perform the erase operation in the unit of a memory cell.

The row decoder 140 selectively couples the global lines to the local lines DSL, WL0~WLn, and SSL so that the operation voltages outputted to the global lines from the voltage generation circuit 130 are delivered to the local lines DSL, WL0~WLn and SSL of the selected memory block 110MB based on the row address signals RADD. The program voltage Vpgm and the read voltage Vread are supplied from the voltage generation circuit 130 to a selected local word line (e.g., WL0) coupled to the selected cell (e.g., C0e1) through the global word line. Meanwhile, the pass voltage Vpass is supplied from the voltage generation circuit 130 to the unselected local word lines (e.g., WL1~WLn) through the global word lines. In the erase operation, the erase voltage Verase may be supplied to every memory cell in a block. Accordingly, data is stored in the selected cell (e.g., C0e1) by using the program voltage Vpgm, and the data stored in the selected cell (e.g., C0e1) is read by using the read voltage Vread.

The page buffer block 150 includes page buffers PB1~PBk coupled to the memory cell array 110 through the bit lines BLe1~BLek and BLo1~BLok. The page buffers PB1~PBk of the page buffer block 150 selectively precharge the bit lines BLe1~BLek or BLo1~BLok according to data inputted for storing data in the memory cells C0e1~C0ek or C0o1~C0ok based on the PB control signal PBCON of the control circuit 120, or senses voltage of the bit lines BLe1~BLek or BLo1~BLok to read data from the memory cells C0e1~C0ek or C0o1~C0ok.

For example, when program data ('0') to be stored in the memory cell C0e1 is inputted to a page buffer PB1, the page buffer PB1 supplies a program allowance voltage (ground voltage) to the bit line BLe1 of the memory cell C0e1 where the program data is to be stored. As a result, threshold voltage of the memory cell C0e1 increases by the program voltage Vpgm supplied to the word line WL0 and the program allowance voltage supplied to the bit line BLe1 in the program operation. Meanwhile, when the erase data ('1') to be stored in the memory cell C0e1 is inputted to the page buffer PB1, the page buffer PB1 supplies a program inhibition voltage (supply voltage) to the bit line BLe1 of the memory cell C0e1 where the erase data is to be stored. As a result, threshold voltage of the memory cell C0e1 is not increased by the program inhibition voltage supplied to the bit line BLe1 while the program voltage Vpgm is supplied to the word line WL0 in the program operation. Different data may be stored in the memory cells because the threshold voltages of the memory cells may vary.

Further, in the read operation, the page buffer block 150 precharges the entire even-numbered bit lines (BLe1~BLek) selected from the even-numbered bit lines BLe1~BLek and the odd-numbered bit lines BLo1~BLok, and discharges the unselected odd-numbered bit lines (BLo1~Blok). When the read voltage Vread is supplied to the selected word line WL0 from the voltage supply circuit 135, the bit lines of the memory cells where the program data is to be stored maintains precharge state, and the bit lines of the memory cells where the erase data is to be stored are discharged. The page buffer block 150 senses voltage change of the selected bit lines (BLe1~BLek), and latches data corresponding to the sensing result in the memory cells.

The column selection circuit 160 selects the page buffers PB1~PBk included in the page buffer block 150 based on the column address signal CADD outputted from the control circuit 120. That is, the column selection circuit 160 sequentially delivers data to be stored in the memory cells to the page buffers PB1~PBk based on the column address signal CADD. Additionally, the column selection circuit 160 sequentially selects the page buffers PB1~PBk based on the column address signal CADD so that data of the memory cells latched in the page buffers PB1~PBk is outputted to an exterior in the read operation.

The input/output circuit 170 delivers data to the column selection circuit 160 in response to control of the control circuit 120 to deliver data inputted from an exterior to the page buffer block 150 in the program operation. When the column selection circuit 160 delivers the data inputted from the input/output circuit 170 to the page buffers PB1~PBk of the page buffer block 150 as mentioned above, the page buffers PB1~PBk store the inputted data in an internal latch circuit. The input/output circuit 170 outputs data delivered from the page buffers PB1~PBk of the page buffer block 150 through the column selection circuit 160 to an external when the read operation is performed.

The pass/fail check circuit 180 outputs a pass/fail signal PFS based on comparison result signals outputted from the page buffers PB1~PBk in a program verify operation performed after the program operation. Particularly, in the program verify operation, threshold voltage of the memory cell is compared with a target voltage, and the comparison result is latched in the latch circuit of the page buffers PB1~PBk. The comparison result signals corresponding to the latched comparison result is outputted to the pass/fail check circuit 180. The pass/fail check circuit 180 outputs the pass/fail signal PFS indicating whether the program operation is completed to the control circuit 120 based on the comparison result signals. The control circuit 120 detects whether a memory cell, which has threshold voltage that is lower than the target voltage of the programmed memory cells exists based on the pass/fail signal PFS, and determines whether performing an additive program operation is required based on the detection result.

Especially, the control circuit 120 controls the operation circuit to perform the erase operation in the unit of a memory cell. The control circuit 120 controls the operation circuit so that threshold voltage of a memory cell for storing first data increases to a voltage higher than a first level by performing a program operation on the memory cell, and threshold voltage of a memory cell for storing second data is decreased to a voltage lower than a second level by performing the erase operation in the unit of a memory cell, the second level being lower than the first level.

The erase operation is performed in the unit of a memory cell by using a gate induced drain leakage (GIDL) erase method.

Figure 3:
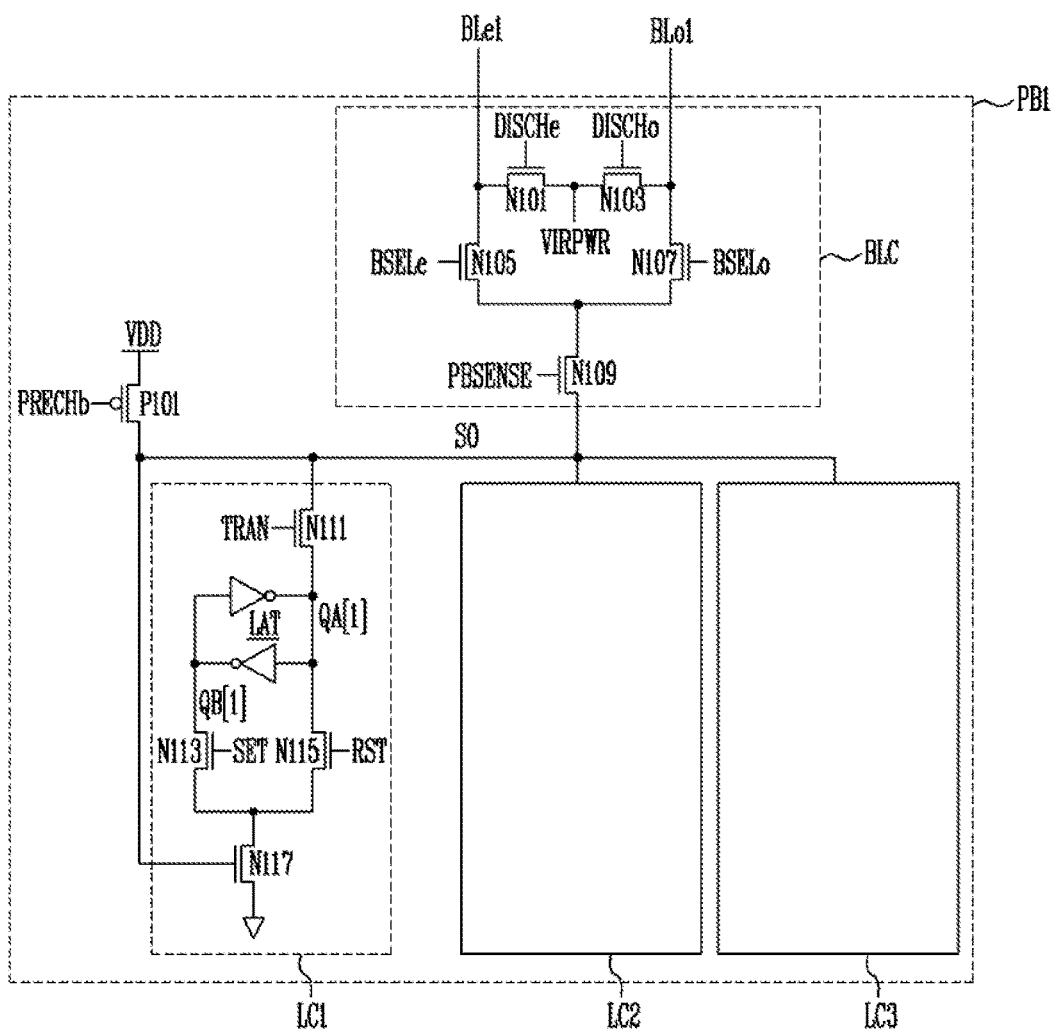
FIG. 3 is a detailed diagram illustrating a page buffer shown in FIG. 1.

FIG. 3 is detailed diagram of the page buffer PB1 shown in FIG. 1.

Referring to FIGS. 1 to 3, the page buffer PB1 operates in response to control of the control circuit 120. Following signals PRECHb, TRAN, RST, SET, PBSENSE, BSELe, BSELo, DISCHe and DISCHo may be outputted from the control circuit 120.

The page buffer PB1 may include a bit line coupling circuit BLC, a precharge circuit P101 and latch circuits LC1~LC3.

Switching elements N105 and N107 of the bit line coupling circuit BLC select one of an even-numbered bit line BLe1 and an odd-numbered bit line BLo1 in response to bit line selection signals BSELe and BSELo. Switching elements N101 and N103 precharge a bit line not selected in the program operation, and discharge a bit line not selected in the read operation in response to discharge signals DISCHe and DISCHo. A switching element N109 couples the bit line selected by the switching elements N105 and N107 to one of the latch circuits LC1~LC3 in response to a coupling signal PBSENSE. The latch circuits LC1~LC3 are coupled in parallel to the switching element N109 through a sensing node SO.

The precharge circuit P101 precharges the sensing node SO in response to a precharge signal PRECHb.

The number of the latch circuits LC1~LC3 may be changed in accordance with design. The number of the latch circuits LC1~LC3 is assumed as 3 for convenience of description. Only one of the latch circuits LC1~LC3 is generally activated. A first latch circuit LC1 may temporarily store data inputted from the column selection circuit 160 and may deliver the data to a second latch circuit LC2, and may temporarily store data read from the memory cell by the read operation, and may output the read data to the column selection circuit 160. The second latch circuit LC2 may supply the program inhibition voltage or the program allowance voltage to the bit line in the program operation in accordance with the data delivered from the first latch circuit LC1. Further, the second latch circuit LC2 may temporarily store the data stored in the memory cell based on to a voltage of the bit line in the read operation, and deliver the stored data to the first latch circuit LC1. The third latch circuit LC3 may latch the comparison result of the threshold voltage of the memory cell and the target voltage in the verify operation performed after the program operation, and output the comparison result signal corresponding to the comparison result to the pass/fail check circuit 180.

Each of the latch circuits LC1~LC3 includes switching elements and a latch. Operation of the latch circuits will be described through the first latch circuit LC1.

The first latch circuit LC1 may include a latch LAT for latching data, a switching element N111 for coupling a first node QA<1> of the latch LAT to the sensing node SO in response to a transmission signal TRAN, switching elements N113 and N115 coupled to the first node QA<1> (non-inverting terminal) and a second node QB<1> (inverting terminal) of the latch LAT and operating in response to a set signal SET and a reset signal RST, and a switching element N117 coupled between the switching elements N113 and N115 and a ground terminal and operating based on potential of the sensing node SO.

Since signals having different waveform are inputted to different latch circuits LC2 and LC3, only one latch circuit may be activated or the latch circuits may perform different functions, although the latch circuits have the same constitution.

Figure 4:
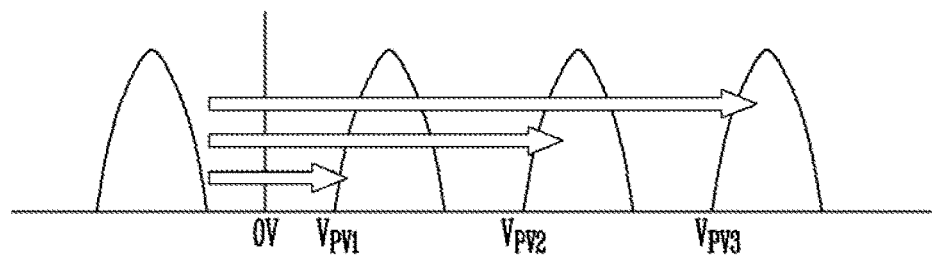
FIG. 4 is a view for explaining first program process.

FIG. 4 is a view for explaining first program process.

In FIG. 4, the semiconductor memory device using the first program process increases threshold voltage of memory cells to program the memory cells having erase state (first state) to second state, third state and fourth state, respectively.

In this case, the threshold voltage of the memory cells is considerably changed, and thus threshold voltage distribution of the memory cells is highly changed due to interference.

Figure 5:
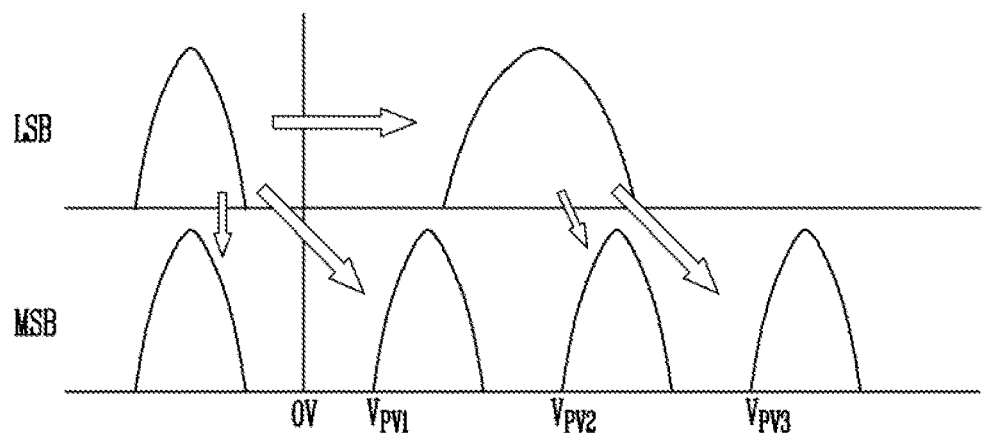
FIG. 5 is a view for explaining second program process.

FIG. 5 is a view for explaining second program process.

In FIG. 5, the semiconductor memory device using the second program process increases threshold voltage of memory cells to a preset level by performing a least significant bit (LSB) program operation on the memory cells.

Subsequently, the semiconductor memory device increases threshold voltage of memory cells to be programmed to the second state to a voltage higher than a first verify voltage Vpv1, increases threshold voltage of memory cells to be programmed to the third state to a voltage higher than a second verify voltage Vpv2, and increases threshold voltage of memory cells to be programmed to the fourth state to a voltage higher than a third verify voltage Vpv3, by performing a most significant bit (MSB) program operation.

In this case, change of threshold voltage of the memory cells becomes smaller than that of the first program process in FIG. 4, and thus change of threshold voltage distribution of the memory cells due to interference becomes smaller than that of the first program process in FIG. 4. However, since only program operations for increasing threshold voltage of the memory cells is performed, the threshold voltage of neighboring memory cells is to be changed in only the positive direction. Accordingly, the threshold voltage distribution of the memory cells also increases due to interference in this case.

Figure 6:
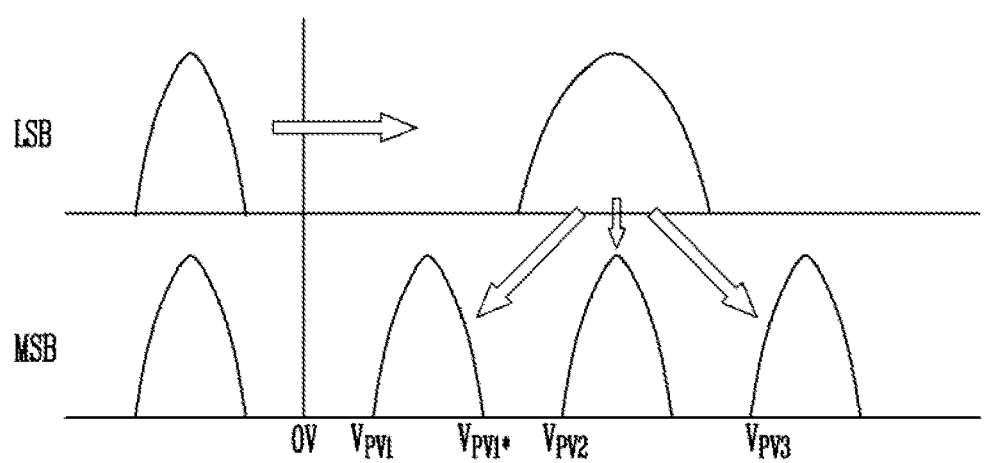
FIG. 6 is a view for explaining third program process in accordance with an embodiment of the present invention.
Figure 7:
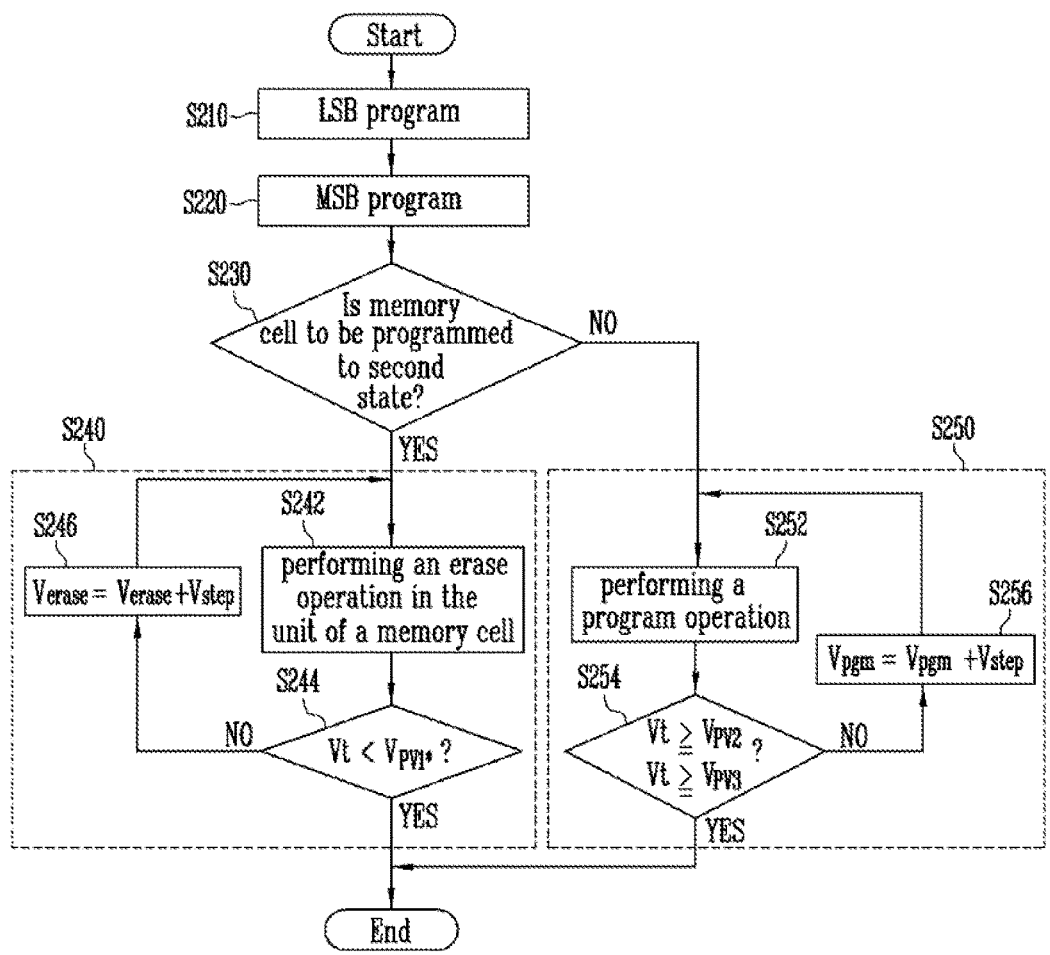
FIG. 7 is a flowchart illustrating a method of operating a semiconductor memory device using the third program process in accordance with the embodiment of the present invention.

FIG. 6 is a view for explaining third program process in accordance with an embodiment of the present invention. FIG. 7 is a flowchart illustrating a method of operating a semiconductor memory device using the third program process in accordance with the embodiment of the present invention.

The method of operating the semiconductor memory device will be described through a program operation of 2 bit multi-level cell, for convenience of description. However, the present embodiment may be applied to a program operation of 3 bit multi-level cell and a program operation of n bit multi-level cell.

In FIGS. 6 and 7, the semiconductor memory device using the third program process increases threshold voltage of memory cells to a preset level by performing an LSB program operation at step S210. An incremental step pulse program (ISPP) method and a program verify operation may not be performed for the LSB program operation, and thus program operation speed may increase.

At step S220, an MSB program operation is performed. At step S230, it is checked whether a selected memory cell is to be programmed to the second state, when the MSB program operation is performed on memory cells in a first page.

When it is checked that the selected memory cell is to be programmed to the second state in the step S230, the process proceeds to step S240. At the step S240, an erase operation is performed on the memory cells to be programmed to the second state in the unit of a memory cell. More specifically, an erase loop including the erase operation and an erase verify operation based on a first erase verify voltage Vpv1* is performed. The erase operation and the erase verify operation are performed in the unit of a memory cell. The erase operation is performed on the memory cell in the unit of a memory cell at step S242. The erase operation is performed by using the GIDL erase method. This will be described in detail. At step S244, it is checked whether threshold voltage of every memory cell to be programmed to the second state of the memory cells in the first page is lower than the first erase verify voltage Vpv1* through the erase verify operation, which is performed in the unit of a memory cell on the basis of the first erase verify voltage Vpv1*. When it is checked that a memory cell of which threshold voltage is higher than the first erase verify voltage Vpv1* exists, an erase voltage Verase is increased by a step voltage Vstep at step S246, and then the erase operation is again performed in the unit of a memory cell, that is, the process returns to the step S242. Meanwhile, when it is checked that a memory cell that has threshold voltage, which is higher than the first erase verify voltage Vpv1*, does not exist, the process ends.

On the other hand, when it is checked that the selected memory cell is not to be programmed to the second state in the step S230, the process proceeds to step S250. At the step S250, a program operation is performed on memory cells that are not to be programmed to the second state, i.e., memory cells to be programmed to the third state or the fourth state. More specifically, a program loop including the program operation and a program verify operation based on a second verify voltage Vpv2 and a third verify voltage Vpv3 is performed. First, the program operation is performed on the memory cells at step S252. At step S254, through the program verify operation based on the second verify voltage Vpv2 and the third verify voltage Vpv3, it is checked whether threshold voltage of every memory cell to be programmed to the third state of the memory cells in the first page is higher than the second verify voltage Vpv2 and is checked whether threshold voltage of every memory cell to be programmed to the fourth state is higher than the third verify voltage Vpv3. When it is checked that a memory cell, which has threshold voltage that is lower than the second verify voltage Vpv2, exists in the memory cells to be programmed to the third state, or when it is checked that a memory cell, which has threshold voltage that is lower than the third verify voltage Vpv3, exists in the memory cells to be programmed to the fourth state, a program voltage Vpgm is increased by a step voltage Vstep at step S256, and then the program operation is again performed. That is, the process returns to the step S252. Meanwhile, when it is checked that a memory cell, which has threshold voltage that is lower than the second verify voltage Vpv2, does not exist in the memory cells to be programmed to the third state, and when it is checked that a memory cell, which has threshold voltage that is lower than the third verify voltage Vpv3, does not exist in the memory cells to be programmed to the fourth state, the process ends.

In accordance with the embodiment of the present invention, the semiconductor memory device changes the threshold voltage of the memory cells in the positive direction and the negative direction by performing the erase operation in the unit of a memory cell in accordance with state of the memory cell in the program operation, and thus total change of the threshold voltage and change of threshold voltage distribution of the memory cell due to interference may be reduced.

Figures 8, 9:
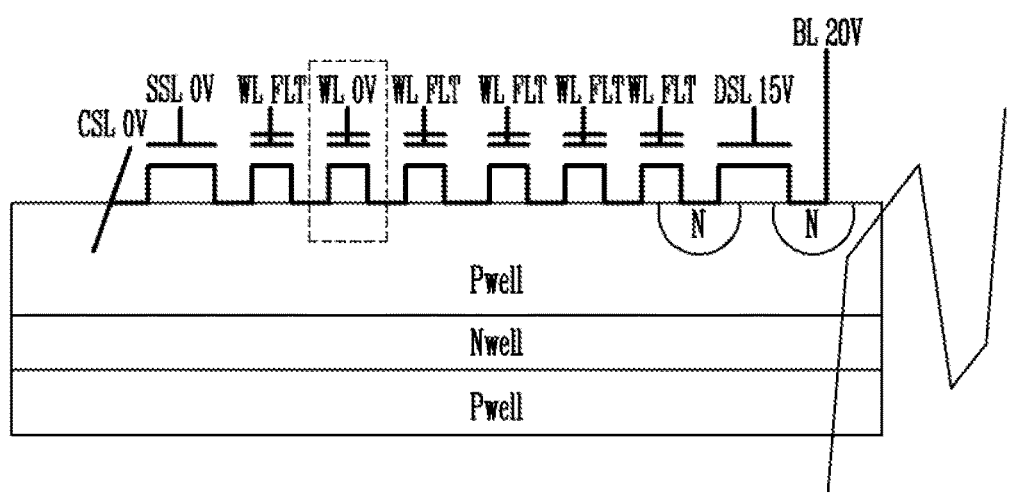
FIG. 8 is a view for explaining program order in accordance with the embodiment of the present invention.
FIG. 9 is a view for explaining an erase operation in accordance with the embodiment of the present invention.

FIG. 8 is a view for explaining program order in accordance with the embodiment of the present invention.

In FIG. 8, an LSB program operation is performed on an even page and an odd page of a first word line WL00 (0, 1), an LSB program operation is performed on an even page and an odd page of a second word line WL01 (2, 3), and an MSB program operation is performed on the even page and the odd page of the first word line WL00.

Accordingly, the threshold voltage of neighboring memory cells is changed in the positive direction and the negative direction when a program operation of specific memory cell is performed, and thus threshold voltage distribution of the memory cell due to interference may be reduced.

FIG. 9 is a view for explaining an erase operation in accordance with the embodiment of the present invention. FIG. 10 is a table for explaining voltage supply condition in the program operation and the erase operation in accordance with the embodiment of the present invention.

In FIGS. 9 and 10, the erase operation is generally performed in the unit of a block by supplying an erase voltage as high voltage to a p-well. However, in accordance with the embodiment of the present invention, the erase operation is performed in the unit of a memory cell by supplying high voltage to a bit line instead of the p-well.

When a high voltage (e.g., 15V) is supplied to a gate of a drain select transistor and a high voltage (e.g., 20V) is supplied to a bit line, the electron-hole pairs by GIDL are formed by voltage difference between a gate of the drain select transistor DST and a bit line junction. The electron-hole pairs move into a channel of a string. When a ground voltage (0V) is supplied to a selected word line and word lines not selected maintain floating state, the electron-hole pairs may increase the channel potential. As a result, the selected memory cell may be erased.

Structure of the well should be changed to perform the GIDL erase operation. It may be sufficient to include only a p-well area when the erase operation is performed in the unit of a block. However, to perform the erase operation in the unit of a memory cell using the GIDL method, an n-well area surrounding the p-well area and another p-well area surrounding the n-well area may be required. That is, the n-well area is newly formed, and thus an increase of channel voltage by the electron-hole pairs generated by the GIDL may be separated to areas between cell strings.

Figure 11:
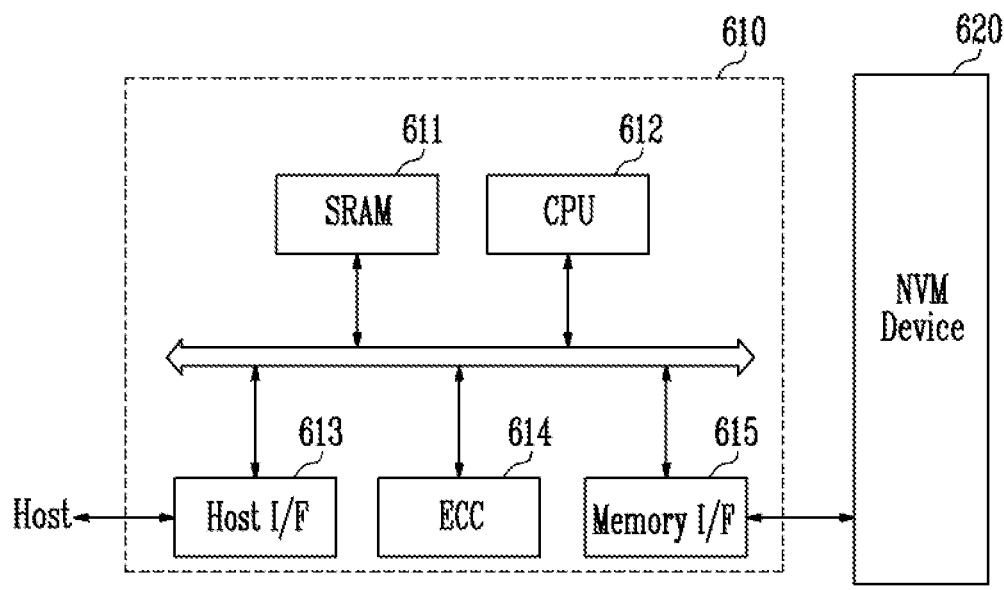
FIG. 11 is a block diagram illustrating a memory system including a non-volatile memory device for performing an operation in accordance with the embodiment of the present invention.

FIG. 11 is a block diagram illustrating a memory system including a non-volatile memory device for performing an operation in accordance with the embodiment of the present invention.

In FIG. 11, the memory system 600 of the present embodiment may include a non-volatile memory device 620 and a memory controller 610.

The non-volatile memory device 620 may be the semiconductor memory device described above and operate in accordance with the above method for compatibility of the memory controller 610. The memory controller 610 controls the non-volatile memory device 620. The memory system 600 may be used as a memory card or a solid state disk SSD by combination of the non-volatile memory device 620 and the memory controller 610. An SRAM 611 is used as an operation memory of a processing unit 612. A host interface 613 has data exchange protocol of a host accessed to the memory system 600. An error correction block 614 detects and corrects error of data read from the non-volatile memory device 620. A memory interface 614 interfaces with the non-volatile memory device 620 of the present invention. The processing unit 612 performs control operation for data exchange of the memory controller 610.

The memory system 600 of the present invention may further include a ROM (not shown) for storing code data to interface with the host. The non-volatile memory device 620 may be provided as multi-chip package including flash memory chips. The memory system 600 of the present invention may be provided as high-reliable storage medium having low error possibility. The flash memory device of the embodiment of the present invention may be included in the SSD studied actively in recent. In this case, the memory controller 610 communicates with an external device (e.g., host) through one of various interface protocols such as USB, MMC, PCI-E, SATA, PATA, SCSI, ESDI, IDE, etc.

Figure 12:
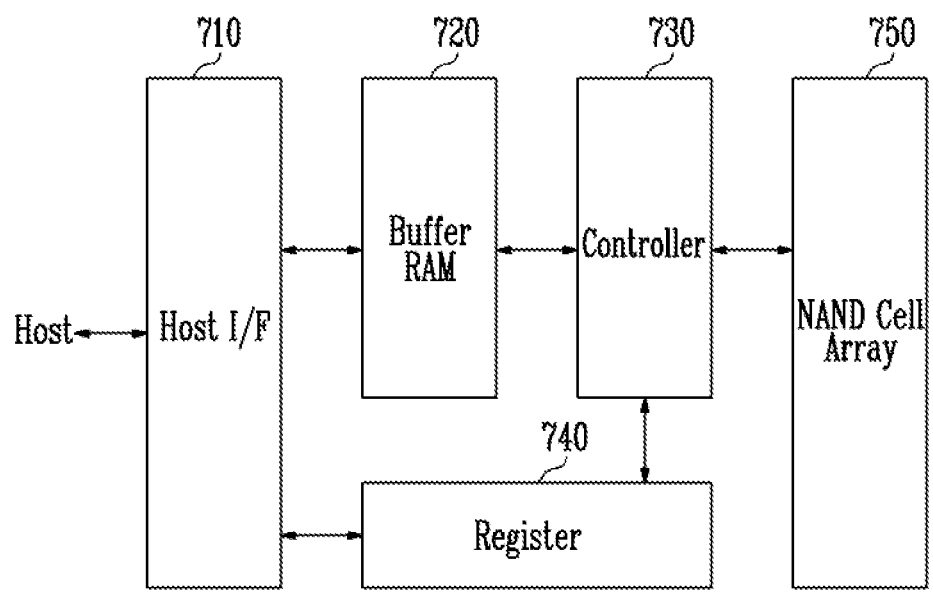
FIG. 12 is a block diagram illustrating a fusion memory device or a fusion memory system for performing an operation in accordance with the embodiment of the present invention.

FIG. 12 is a block diagram illustrating a fusion memory device or a fusion memory system for performing an operation in accordance with the embodiment of the present invention. For example, features of the present invention may be supplied to an OneNAND flash memory device 700 as a fusion memory device.

The OneNAND flash memory device 700 includes a host interface 710 for exchanging information with a device using different protocol, a buffer RAM 720 for embedding code for driving the memory device or storing temporarily data, a controller 730 for controlling reading, programming and every state in response to a control signal and a command inputted from an outside device, a register 740 for storing data such as configuration for defining command, address, system operation environment in the memory device, and a NAND flash cell array 750 having operation circuit including a non-volatile memory cell and a page buffer. The OneNAND flash memory device programs data in accordance with the method described above, in response to write request from the host.

Figure 13:
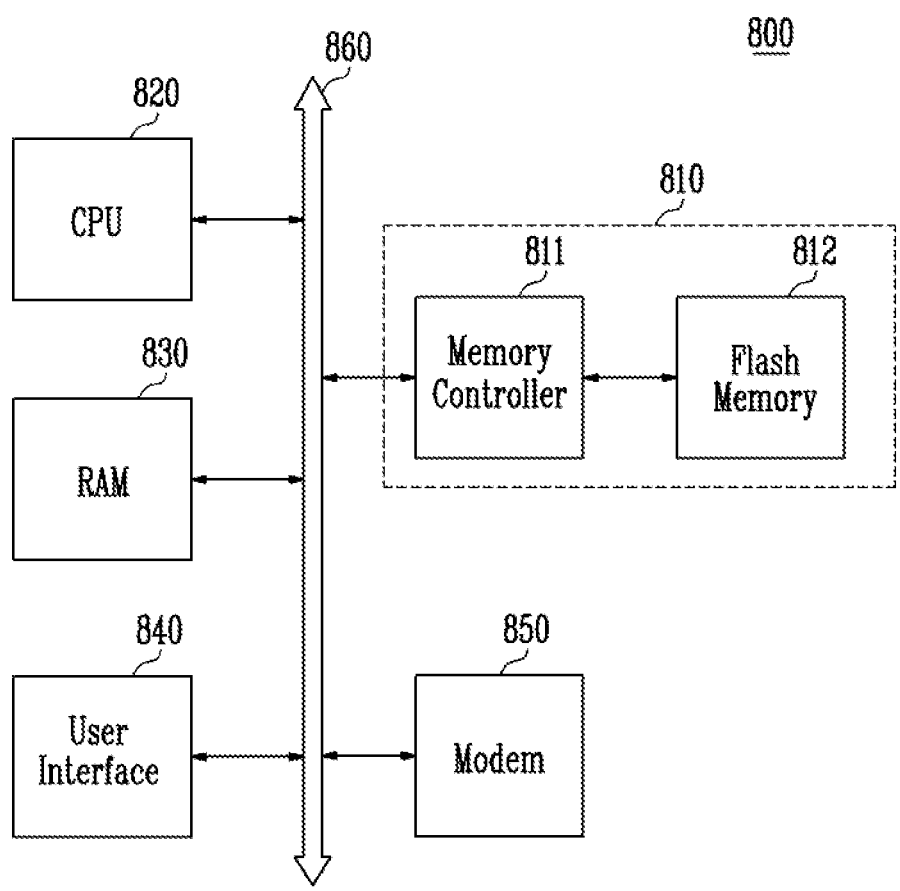
FIG. 13 is a view illustrating a computing system including a flash memory device for performing an operation in accordance with the embodiment of the present invention.

FIG. 13 is a view illustrating a computing system including a flash memory device for performing an operation in accordance with the embodiment of the present invention.

The computing system 800 of the present invention includes a microprocessor 820 connected to a system bus 860, a RAM 830, an user interface 840, a modem 850 such as a baseband chipset, and a memory system 1010. In case that the computing system 800 is a mobile device, a battery (not shown) for supplying an operation voltage of the computing system 1000 may be further provided. The computing system 800 of the present invention may further include an application chipset, a camera image processor CIS, a mobile DRAM, etc. The memory system 810 may include an SSD using for example a non-volatile memory for storing data. The memory system 810 may be supplied to a fusion flash memory (e.g., OneNAND flash memory).

The embodiments of the invention may be realized through a program or a recording medium, where the program is written, as well as the device and the method.

While the present invention has been described with respect to the specific embodiments, it should be noted that the embodiments are for describing, not limiting, the present invention. Further, it should be noted that the present invention may be achieved in various ways through substitution, change, and modification, by those skilled in the art without departing from the scope of the present invention as defined in the following claims.

What is claimed is:

1. A programming method of a semiconductor memory device, the method comprising:
   performing a first program operation on first memory cells among a plurality of memory cells, the first program operation comprising programming the first memory cells to a first state;
   performing a second program operation on the first memory cells having the first programmed state;
   wherein the second program operation comprises determining a plurality of second memory cells among the first memory cells which are to be programmed to a second state, the second state being a state that is lower than the first state, and a plurality of third memory cells among the first memory cells other than the second memory cells which are to be programmed to a third state or a fourth state, the third state being a state that is higher than the first state and the fourth state being a state that is higher than the third state;
   performing an erase operation on the second memory cells to be in the second state after determining the second memory cells; and
   programming the third memory cells to be in the third state or the fourth state after performing the erase operation,
   wherein a first threshold voltage distribution corresponding to the first state is between a second threshold voltage distribution corresponding to the second state and a third threshold voltage distribution corresponding to the fourth state.

2. The programming method of claim 1, wherein the erase operation is a GIDL erase operation.

3. The programming method of claim 1, wherein the erase operation comprises performing the erase operation and an erase verify operation based on a first erase verify voltage, checking whether a threshold voltage of each of the second memory cells is lower than the first erase verify voltage through the erase verify operation, and when at least one memory cell among the second memory cells, having a threshold voltage higher than the first erase verify voltage exists, an erase voltage is increased by a step voltage.

4. The programming method of claim 3,
   wherein the programming step of the third memory cells to the third or fourth state comprises a program loop including a program operation and a program verify operation based on a second verify voltage and a third verify voltage to check whether a threshold voltage of each of the third memory cells to be programmed to the third state is higher than the second verify voltage and whether a threshold voltage of each of the third memory cells to be programmed to the fourth state is higher than the third verify voltage, and
   wherein when it is determined that a memory cell exists among the third memory cells to be programmed to the third state which has a threshold voltage that is lower than the second verify voltage, or when it is determined that a memory cell exists among the third memory cells to be programmed to the fourth state which has a threshold voltage that is lower than the third verify voltage, a program voltage is increased by a step voltage and the programming of the third memory cells to the third and fourth states is repeated.

5. A semiconductor memory device comprising:
   a memory cell array configured to include memory cells;
   an operation circuit configured to perform a first program operation, and a second program operation, the second program operation including an erase operation on memory cells; and
   a control circuit configured to control the operation circuit, to perform a first program operation on first memory cells among a plurality of memory cells to program the first memory cells to a first state, determine whether the first memory cells are to be programmed to a second state lower than the first state or to be programmed to a third state higher than the first state or to a fourth state higher than the third state after performing the first program operation, wherein memory cells of the first memory cells to be programmed to the second state are defined as second memory cells and other memory cells of the first memory cells to be programmed to the third or the fourth state are defined as third memory cells, perform an erase operation on the second memory cells to be in the second state after determining the second memory cells and perform a second program operation on the third memory cells to be in the third or the fourth state after performing the erase operation,
   wherein a first threshold voltage distribution corresponding to the first state is between a second threshold voltage distribution corresponding to the second state and a third threshold voltage distribution corresponding to the fourth state.

6. The semiconductor memory device of claim 5, wherein the control circuit controls the operation circuit to perform the erase operation by a GIDL erase operation.

7. The semiconductor memory device of claim 5, wherein, in the memory cell array, a p-well region, on which each of the memory cells are formed, is separated from another cell string by an n-well region surrounding the p-well region.

8. A programming method of a semiconductor memory device, the method comprising:

performing a first program operation on first memory cells among a plurality of memory cells, the first program operation comprising programming the first memory cells to a first state;

performing a second program operation on the first memory cells having the first programmed state;

wherein the second program operation comprises determining a plurality of second memory cells among the first memory cells which are to be programmed to a second state, the second state being a state that is lower than the first state, and a plurality of third memory cells among the first memory cells other than the second memory cells which are to be programmed to a third state or a fourth state, the third state being a state that is higher than the first state and the fourth state being a state that is higher than the third state;

performing an erase operation on the second memory cells to be in the second state; and programming the third memory cells to be in the third state or the fourth state, wherein a first threshold voltage distribution corresponding to the first state is between a second threshold voltage distribution corresponding to the second state and a third threshold voltage distribution corresponding to the fourth state, and wherein the erase operation comprises performing the erase operation and an erase verify operation based on a first erase verify voltage, checking whether a threshold voltage of each of the second memory cells is lower than the first erase verify voltage through the erase verify operation, and when at least one memory cell among the second memory cells, having a threshold voltage higher than the first erase verify voltage exists, an erase voltage is increased by a step voltage.

9. The programming method of claim 8, wherein the programming step of the third memory cells to the third or fourth state comprises a program loop including a program operation and a program verify operation based on a second verify voltage and a third verify voltage to check whether a threshold voltage of each of the third memory cells to be programmed to the third state is higher than the second verify voltage and whether a threshold voltage of each of the third memory cells to be programmed to the fourth state is higher than the third verify voltage, and wherein when it is determined that a memory cell exists among the third memory cells to be programmed to the third state which has a threshold voltage that is lower than the second verify voltage, or when it is determined that a memory cell exists among the third memory cells to be programmed to the fourth state which has a threshold voltage that is lower than the third verify voltage, a program voltage is increased by a step voltage and the programming of the third memory cells to the third and fourth states is repeated.

* * * * *